United States Patent [19]

Ponczak et al.

[11] 4,113,516

[45] Sep. 12, 1978

[54] METHOD OF FORMING A CURVED IMPLANTED REGION IN A SEMICONDUCTOR BODY

[75] Inventors: Samuel Ponczak; John Aaron Olmstead, both of Somerville, N.J.

[73] Assignee: RCA Corporation, New York, N.Y.

[21] Appl. No.: 763,721

[22] Filed: Jan. 28, 1977

[51] Int. Cl.² ............................................. H01L 21/265
[52] U.S. Cl. ....................................... 148/1.5; 148/187; 357/20; 357/48; 357/91
[58] Field of Search .................. 357/56, 91, 47, 48, 357/20; 148/1.5, 187

[56] References Cited

U.S. PATENT DOCUMENTS

| 3,620,851 | 11/1971 | King et al. | 148/1.5 |
|---|---|---|---|
| 3,697,827 | 10/1972 | Simon | 317/235 |
| 3,730,778 | 5/1973 | Shannon et al. | 148/1.5 |
| 3,890,632 | 6/1976 | Ham et al. | 357/23 |
| 3,899,363 | 8/1975 | Dennard et al. | 148/1.5 |
| 3,901,737 | 8/1975 | Dash | 148/1.5 |
| 3,947,866 | 3/1976 | Stellrecht | 357/91 |
| 4,004,949 | 1/1977 | Lesk | 148/1.5 |
| 4,029,522 | 6/1977 | De La Moneda | 148/1.5 |

OTHER PUBLICATIONS

C. L. Bertin, "Lateral Transistor with Built-In Electric Field", IBM Tech. Disc. Bull. 16, (1973) 280.
J. E. Ziegler et al., "Self-Isolating Bath-Tub Collector for a Planar Transistor", IBM Tech. Disc. Bull. 14, (1971) 1635.
A. Lekholm et al., "Edge-Breakdown in Mesa Diodes", IEEE Trans. Electronic Devices, ED-18, (1971) 844.

*Primary Examiner*—R. Dean
*Assistant Examiner*—Upendra Roy
*Attorney, Agent, or Firm*—H. Christoffersen; R. A. Hays

[57] ABSTRACT

A method is disclosed whereby a region having a varying conductivity profile and depth is formed in a body of semiconductor material. The method includes the step of implanting conductivity modifiers beneath a curved surface of the body. Such a region, fabricated by the present method, is particularly useful as one element of a semi-conductor device.

5 Claims, 4 Drawing Figures

METHOD OF FORMING A CURVED IMPLANTED REGION IN A SEMICONDUCTOR BODY

The present invention relates in general to a method of forming a region in a portion of a body of semiconductor material and, in particular, relates to a method for forming such a region so that it has a varying conductivity profile and depth.

Regions having a varying conductivity profile and depth, and a varying sheet resistivity, can be used either as an integral part of a semiconductor device or as one element of a semiconductor integrated circuit. Such a region is particularly desirable in a semiconductor mesa device, for example. In conventional mesa devices, for example transistors having a mesa edge, the base-collector PN junction is substantially parallel to an upper surface of the device and terminates at a sidewall of the mesa edge. In such a device when the base-collector PN junction is reverse biased, the strength of the electric field sustained across the depletion region is greatest at or near the PN junction/sidewall intercept. This condition, as known in the art, often results in the avalanching of the PN junction at the PN junction/sidewall intercept at voltages which are considerably lower than that sustainable by the portion of the PN junction which is in the bulk material of the semiconductor body. To increase the voltage capability of such a PN junction, it is quite desirable to spread, or extend, the electric field along the surface near the PN junction/sidewall intercept and thereby decrease the strength of the electric field thereat. This can be accomplished by forming a region having a varying conductivity profile and depth beneath the surface of the mesa sidewall.

A semiconductor resistor having a varying resistance therealong is an element which can also be useful in integrated circuit devices. The term varying resistor, as used herein, means a semiconductor resistive region having a sheet resistivity which varies along the length thereof. Such a resistor can be utilized to provide a particular amount of resistive compensation merely by locating the contacts thereof at different positions along the surface of the resistive region. Such compensation can be utilized to perform, among other things, a ballasting function for a transistor.

The present method provides a process for forming a resistor type element having a varying conductivity profile and depth in a body of semiconductor material.

Figure 1:
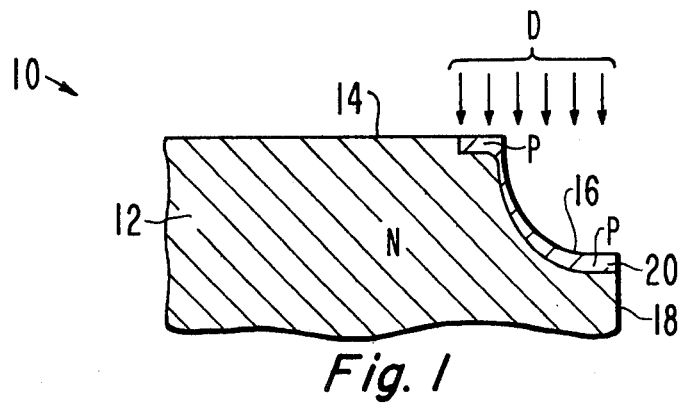
FIGS. 1 and 2 are partial cross-sectional views of sequential steps in the present method, not drawn to scale.
Figure 2:
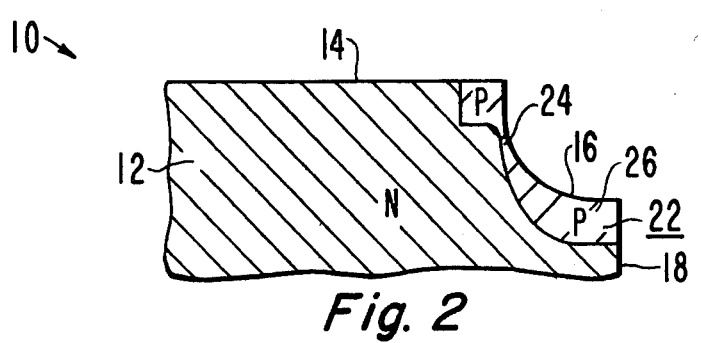

A workpiece upon which the present method may be performed is a portion, indicated generally at 10 in FIGS. 1 and 2, of a body 12 of semiconductor material. The body 12 has at least one substantially flat surface 14. Preferably, although not necessarily, the body 12 is intially of an N type conductivity silicon.

A curved surface 16 is provided on the semiconductor body 12. It should be noted that the curved surface 16 while shown in the drawings as terminating along a side edge 18 of the body 12, may be a moat, not shown, completely within the boundaries of the semiconductor body 12. The curved surface 16 may be formed by any method known in the semiconductor art, for example, by chemical etching and photolithographic techniques, laser burning, or the like.

After the curved surface 16 is formed and cleaned, at least the curved surface 16 of the body 12 is exposed to a dose D of conductivity modifying ions, for example boron ions, which, upon penetrating the curved surface 16, alter the conductivity of the body 12 therebelow. The conductivity modifying ions which impinge upon the curved surface 16 penetrate into the body 12 to a particular depth. The depth of penetration is dependent upon both the flux of the ions and the energy imparted thereto by the source thereof. In addition, it is understood that the depth of penetration is also dependent upon the orientation of the cyrstal with respect to the direction of the ion source. Preferably the dose D has an average energy of about 150KeV and a flux of about $3 \times 10^{15}$ ions/cm$^2$. One known method of providing a flux of conductivity modifying ions onto the semiconductor body 12 is known as ion implantation. Standard ion implanting machines and techniques may be used to implant the conductivity modifying ions beneath the curved surface 16. By beneath, in this instance, it is meant that a thin layer 20 of conductivity modifiers is formed beneath the curved surface 16; for example, the layer 20 may extend into the body 12 between from about 0.25 micrometers to about 0.50 micrometers.

The body 12 is then treated to drive the conductivity modifiers deeper into the material of the body 12. The drive-in time and temperature can be that which is used in conventional semiconductor diffusion techniques. For example, the body 12 can be heated to a temperature of about 1200°C. for about 24 hours. This results in a region 22 having a surface carrier concentration on the order of about 1018 atoms/cm$^3$ and extending to a depth of between from about 12 micrometers to about 100 micrometers.

As shown in FIG. 2, the resulting resistor type region 22 is such that the upper portion 24 of the region 22 nearest the flat surface 14 has a comparatively higher sheet resistivity than the lower portion 26 of the region 22 furthest away from the surface 14. The sheet resistivity of the region 22 changes in a continuous manner between these extremes. This is because the curved surface over the upper portion 24 of the region 22 initially has fewer ions on a unit area basis, impinging thereon than the lower portion 26 of the region 22 further away; thus, the conductivity modifier density within the material is less after the drive-in step along the upper portion 24 than along the lower portion 26. Hence, the resulting region 22 has a varying conductivity profile and depth.

While the conductivity modifiers discussed above have been indicated in the drawings as being of P type modifiers, N type modifiers may also be used and thereby form, rather than a PN junction an N+ region.

Figure 3:
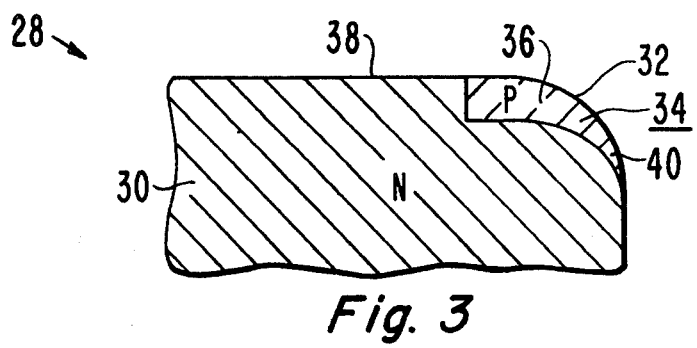
FIG. 3 is a partial cross-sectional view of another region formed by the present method, not drawn to scale.

As shown in FIG. 3, wherein a portion 28 of a semiconductor body 30 is shown, the present method is applicable to a curved surface 32 which is convex as well as one which is concave. Comparing the convex surface 32 of FIG. 3 to the concave surface 16 of FIG. 2, the direction of increasing sheet resistivity along the region 22 of the portion 10 from the upper portion 24 to the lower portion 26 has been reversed. That is, a region 34 as shown in FIG. 3, has a comparatively lower sheet resistivity upper portion 36 near a substantially flat surface 38 and a comparatively higher sheet resistivity lower portion 40 distant from the surface 38. FIG. 2 provides just the reverse situation.

As used herein the depth of a region, such as 22 or 34, is meant to indicate the distance of the region 22 or 34 from the curved surface 16 or 32 respectively, measured along a line which is normal to the point of measurement on the curved surface 16 or 32.

The resistive region 22 or 34 formed by the present method is one which effectively has a varying resistor type value along its length. As such, it may be contacted, not shown, by known methods in the art at, for example, the flat surface 14 or 38 respectively and along its length, not shown, to provide between those contacts whatever resistance is desired. Hence, the resulting region 22 or 34 may be used as a ballasting resistor, or the like.

Figure 4:
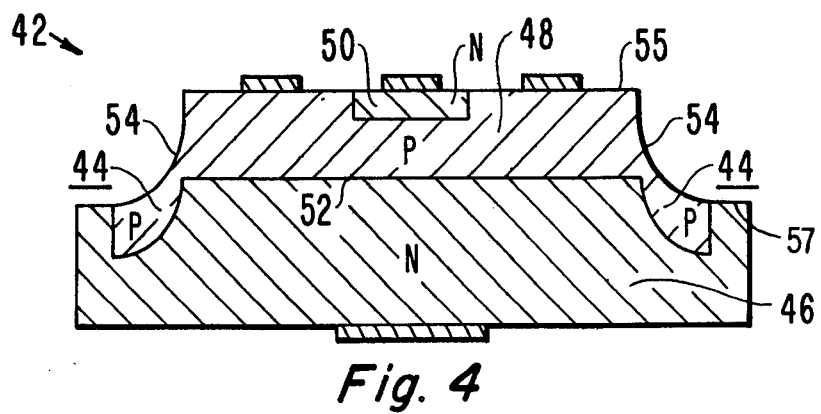
FIG. 4 is a partial cross-sectional view of a semiconductor transistor having therein a region formed by the present method, not drawn to scale.

Another use for such a region 22 or 34, as formed by the present method, is shown in FIG. 4. As used in a device 42 shown in FIG. 4 the region, formed by the present method and indicated therein at 44, needs no external contacts. The device 42 as shown in FIG. 4 is a transistor; however, the present invention and the use thereof is not limited thereto.

The transistor shown in FIG. 4 includes a collector region 46 having an N type conductivity, a P type base region 48, and an N type emitter region 50 within the base region 48. A first PN junction 52 formed at the interface between the base region 48 and the collector region 46 does not terminate at a curved mesa sidewall 54 but is substantially parallel to a flat surface 55. Ordinarily, it should be noted, such a base-collector PN junction 52 would terminate at the sidewall 54 and thus would be relatively difficult to passivate or otherwise deal with. By utilizing the present method a resistive region 44 is provided beneath the curved mesa sidewall 54, forcing the first PN junction 52 to terminate at a point P which is below, for example, the curved mesa sidewall 54. By terminating at what can be considered a bottom portion 57 of the sidewall 54, which is substantially parallel with the flat surface 55 of the device 42, the PN junction 52 can be passivated in planar fashion.

Operationally, the inclusion of such a resistive region 44 reduces the surface field strength along the PN junction 52. The surrounding P type material permits the depletion region of the PN junction 52, under reverse bias conditions, to expand a comparatively greater distance than if the region 44 was absent. That is, by using the concave curve 54, similar to the curve 16 discussed above, the conductivity concentration of the P type base region 48 adjacent the termination of the PN junction 52 has a high sheet resistivity. As known in the semiconductor art, a depletion region depletes a greater distance into material having a higher sheet resistivity than into material having a lower sheet resistivity at a given voltage. Thus, the depletion region at the PN junction 52 intercept extends further away from the PN junction 52 than in conventional mesa devices for a given reverse bias voltage and therefore there is a reduction in the electric field strength at that termination.

The region 44 resulting from the use of the present method makes this method of forming the resistor type region 44 advantageous for reducing the electric field strength at a PN junction 52 termination. For example, conventional methods of reducing the electric field strength at the mesa PN junction 52 intercept include various surface shaping methods and methods for forming a resistive layer over the curved surface of the curved mesa surface. These other methods usually require more processing steps and more accurate techniques than the present method.

What is claimed is:

1. A method of forming a region having a varying sheet resistivity in a body of semiconductor material which comprises the steps of:
   providing a body of semiconductor material having at least one concave curved surfae along a side edge thereof; and
   ion implanting conductivity modifying ions beneath said curved surface whereby a layer having a varying sheet resistivity is formed thereunder.

2. A method as claimed in claim 1 further comprising the step of:
   heating said body of semiconductor material to a temperature at which said conductivity modifiers within said layer diffuse into said body.

3. A method as claimed in claim 1 wherein:
   said conductivity modifying ions are boron ions.

4. A method as claimed in claim 1 wherein:
   said exposing step is performed by exposing said curved surface to conductivity modifying ions having an energy of about 150KeV and a flux of about $3 \times 10^{15}$ ions/cm$^2$.

5. A method as claimed in claim 2 wherein:
   heating said body at a temperature of about 1200°C. for about 24 hours.

* * * * *

UNITED STATES PATENT AND TRADEMARK OFFICE
CERTIFICATE OF CORRECTION

PATENT NO. : 4,113,516

DATED : September 12, 1978

INVENTOR(S) : Samuel Ponczak and John Aaron Olmstead

It is certified that error appears in the above-identified patent and that said Letters Patent is hereby corrected as shown below:

Column 2, line 37: "1018" should be--$10^{18}$--.

Column 4, line 29: "surfae" should be--surface--.

Signed and Sealed this

Thirteenth Day of February 1979

[SEAL]

Attest:

RUTH C. MASON
*Attesting Officer*

DONALD W. BANNER
*Commissioner of Patents and Trademarks*